United States Patent [19]
Costello et al.

[11] Patent Number: 5,483,178
[45] Date of Patent: Jan. 9, 1996

[54] PROGRAMMABLE LOGIC DEVICE WITH LOGIC BLOCK OUTPUTS COUPLED TO ADJACENT LOGIC BLOCK OUTPUT MULTIPLEXERS

[75] Inventors: John C. Costello, San Jose; Rakesh H. Patel, Santa Clara, both of Calif.

[73] Assignee: Altera Corporation, San Jose, Calif.

[21] Appl. No.: 207,012

[22] Filed: Mar. 4, 1994

Related U.S. Application Data

[63] Continuation-in-part of Ser. No. 38,787, Mar. 29, 1993, Pat. No. 5,371,422.

[51] Int. Cl.$^6$ ................................................. H03K 19/177
[52] U.S. Cl. ................................................. 326/41; 326/39
[58] Field of Search ................................. 326/38, 41, 39, 326/44

[56] References Cited

U.S. PATENT DOCUMENTS

| | | | |
|---|---|---|---|
| 3,473,160 | 10/1969 | Wahlstrom | 340/172.5 |
| 4,124,899 | 11/1978 | Birkner et al. | 364/716 |
| 4,398,267 | 8/1983 | Furuyama | 365/182 |
| 4,609,986 | 9/1986 | Hartmann et al. | 364/200 |
| 4,617,479 | 10/1986 | Hartmann et al. | |

(List continued on next page.)

FOREIGN PATENT DOCUMENTS

| | | |
|---|---|---|
| 0081917 | 6/1983 | European Pat. Off. |
| 0415542 | 3/1991 | European Pat. Off. |
| 1444084 | 1/1976 | United Kingdom |

OTHER PUBLICATIONS

R. C. Minnick, "A Survey of Microcellular Research", Journal of the Association for Computing Machinery, vol. 14, No. 2, pp. 203–241, Apr. 1967.

S. E. Wahlstrom, "Programmable Logic Arrays—Cheaper by the Millions", Electronics, Dec. 11, 1967, pp. 90–95.

Stephen S. Yau, "Universal Logic Modules and Their Applications", IEEE Transactions on Computers, vol. C–19, No. 2, Feb. 1970, pp. 141–149.

Richard G. Shoup, Programmable Cellular Logic Arrays (1970) (Ph.D. dissertation, Carnegie–Mellon University (Pittsburgh)).

Carr et al., *MOS/LSI Design and Application*, Texas Instruments Electronics Series, McGraw–Hill and Co., 1972, pp. 229–258.

F. Heutink, "Implications of Busing for Cellular Arrays", Computer Design, pp. 95–100, Nov., 1974.

H. Fleisher et al., "An Introduction to Array Logic", IBM Journal of Research and Development, Mar. 1975, pp. 98–109.

K. Horninger, "A High–Speed ESFI SOS Programmable Logic Array with an MNOS Version", IEEE Journal of Solid State Circuits, vol. SC–10, No. 5, Oct. 1975, pp. 331–336.

B. Kitson et al., "Programmable Logic Chip Rivals Gate Arrays in Flexibility", Electronic Design, Dec. 8, 1983, pp. 95–101.

(List continued on next page.)

*Primary Examiner*—Edward P. Westin
*Assistant Examiner*—Benjamin D. Driscoll
*Attorney, Agent, or Firm*—Fish & Neave; G. Victor Treyz; Robert R. Jackson

[57] ABSTRACT

A programmable logic device is provided that contains a plurality of logic array blocks arranged in rows and columns. The logic array blocks are interconnected with horizontal conductors in each row and vertical conductors in each column. The logic array blocks and the interconnections between conductors are configured using programmable logic. Some of the programmable logic is used to selectively connect logic array block input terminals to the horizontal conductors. Additional logic in each column is used to selectively connect the horizontal conductors to either logic array block output terminals from the same column or logic array block output terminals from an adjacent column. The additional logic prevents certain interconnection pathways from being blocked and increases the overall flexibility of the interconnection scheme of the programmable logic device, thereby improving device performance.

15 Claims, 2 Drawing Sheets

U.S. PATENT DOCUMENTS

| | | | |
|---|---|---|---|
| 4,642,487 | 2/1987 | Carter | 307/465 |
| 4,644,191 | 2/1987 | Fisher et al. | 307/465 |
| 4,677,318 | 6/1987 | Vennstra . | |
| 4,689,654 | 8/1987 | Brockmann | 357/45 |
| 4,706,216 | 11/1987 | Carter | 365/94 |
| 4,713,792 | 12/1987 | Hartmann et al. | 364/900 |
| 4,745,579 | 5/1988 | Mead et al. | 365/104 |
| 4,758,745 | 7/1988 | Elgamal et al. | 307/465 |
| 4,758,985 | 7/1988 | Carter | 365/94 |
| 4,774,421 | 9/1988 | Hartmann et al. . | |
| 4,786,904 | 11/1988 | Graham, III et al. | 340/825.82 |
| 4,818,988 | 4/1989 | Cooperman et al. | 340/825.85 |
| 4,847,612 | 7/1989 | Kaplinsky | 340/825.8 |
| 4,855,619 | 8/1989 | Hsieh et al. | 307/443 |
| 4,870,302 | 9/1989 | Freeman | 307/465 |
| 4,871,930 | 10/1989 | Wong et al. . | |
| 4,873,459 | 10/1989 | El Gamal et al. | 307/465 |
| 4,879,481 | 11/1989 | Pathak et al. | 307/465 |
| 4,899,067 | 2/1990 | So et al. . | |
| 4,912,342 | 3/1990 | Wong et al. . | |
| 4,912,345 | 3/1990 | Steele et al. | 307/465 |
| 4,937,475 | 6/1990 | Rhodes et al. | 307/465 |
| 4,963,768 | 10/1990 | Agrawal et al. | 307/465 |
| 4,963,770 | 10/1990 | Keida | 307/465 |
| 5,015,884 | 5/1991 | Agrawal et al. | 307/465 |
| 5,027,011 | 6/1991 | Steele | 307/465 |
| 5,121,006 | 6/1992 | Pedersen . | |
| 5,122,685 | 6/1992 | Chan et al. | 307/465.1 |
| 5,144,166 | 9/1992 | Camarota et al. | 307/465.1 |
| 5,204,556 | 4/1993 | Shankar | 307/465.1 |
| 5,208,491 | 5/1993 | Ebeling et al. | 326/41 |
| 5,220,214 | 6/1993 | Pedersen . | |
| 5,243,238 | 9/1993 | Kean | 307/465 |
| 5,260,610 | 11/1993 | Pedersen et al. . | |
| 5,260,611 | 11/1993 | Cliff et al. | 326/44 |
| 5,268,598 | 12/1993 | Pedersen et al. | 307/465 |
| 5,350,954 | 9/1994 | Patel . | |
| 5,371,422 | 12/1994 | Patel et al. | 326/41 |

OTHER PUBLICATIONS

Advanced Micro Devices, "The World's Most Versatile Logi Tool; AmPAL22V10", May 1984.

Monolithic Memories, "Programmable Array Logic; PAL20RA10", Jun. 1984.

*The Programmable Gate Array Data Book,* Xilinx, Inc., San Jose, California, 1988.

A. Haines, "Field–Programmable Gate Array with Non–Volatile Configuration", Microprocessors and Microsystems, vol. 13, No. 5, Jun. 1989, pp. 305–312.

K. A. El–Ayat et al., "A CMOS Electrically Configurable Gate Array", IEEE Journal of Solid State Circuits, vol. 24, No. 3, Jun. 1989, pp. 752–762.

F. Furtek et al., "Labyrinth: A Homogeneous Computational Medium", Proc. IEEE 1990 Custom Integrated Circuits Conference, pp. 31.1.1–31.1.4.

H–C. Hsieh et al., "Third–Generation Architecture Boosts Speed and Density of Field–Programmable Gate Arrays", Proc. IEEE 1990 Custom Integrated Circuits Conference, pp. 31.2.1–31.2.7.

M. Ahrens et al., "An FPGA Family Optimized for High Densities and Reduced Routing Delay", Proc. IEEE 1990 Custom Integrated Circuits Conference, pp. 31.5.1–31.5.4.

*The Programmable Gate Array Data Book,* Xilinx, Inc., San Jose, California, 1991, pp. 1–3 through 1–5, pp. 2–1 through 2–13, and 2–61 through 2–69.

PROGRAMMABLE LOGIC DEVICE WITH LOGIC BLOCK OUTPUTS COUPLED TO ADJACENT LOGIC BLOCK OUTPUT MULTIPLEXERS

This application is a continuation-in-part of U.S. application Ser. No. 038,787, filed Mar. 29, 1993, now U.S. Pat. No. 5,371,442.

BACKGROUND OF THE INVENTION

This invention relates to programmable logic devices, and more particularly to programmable logic devices having improved interconnections between adjacent columns of logic array blocks.

Programmable logic devices, which are integrated circuits that can be selectively configured to provide customized logic functions, are well known. Such devices contain many relatively simple logic elements that are interconnected using both fixed and programmable connections. The performance ultimately attained by a programmable logic device is closely related to both the sophistication of the individual logic element building blocks that are used and the capacity of the device to flexibly interconnect this logic. These two resources must be carefully balanced so that the device is capable of being programmed to perform the logic functions that are required without becoming excessively costly or becoming too slow during operation.

Some programmable logic devices contain regions of logic known as logic array blocks, which contain multiple subgroups of logic referred to as "macrocells". In addition to the interconnections within each block for interconnecting the macrocells, global horizontal and vertical conductors and additional programmable interconnections are provided to interconnect the logic array blocks. Commonly-assigned U.S. Pat. No. 5,371,422, describes a programmable logic device of this type that is flexible enough to efficiently implement a wide variety of logic designs. However, some logic designs could be implemented even more efficiently if programmable interconnections of greater flexibility were available.

It is therefore an object of the present invention to provide more flexible interconnections between logic circuit elements in a programmable logic array device.

It is a further object of the present invention to provide improved interconnections that allow macrocell outputs in adjacent columns of logic array blocks to be more readily connected to horizontal conductors.

SUMMARY OF THE INVENTION

These and other objects of the invention are accomplished in accordance with the principles of the present invention by providing a programmable logic device with additional interconnection pathways between adjacent columns of logic. More particularly, multiplexers are provided that can selectively connect the outputs of a logic array block in one column to a set of adjacent horizontal conductors and which can also selectively connect the outputs of a logic array block in an adjacent column to the horizontal conductors. Because logic array block outputs may be connected to the horizontal conductors in more than one way, fewer conflicts arise when configuring the device.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
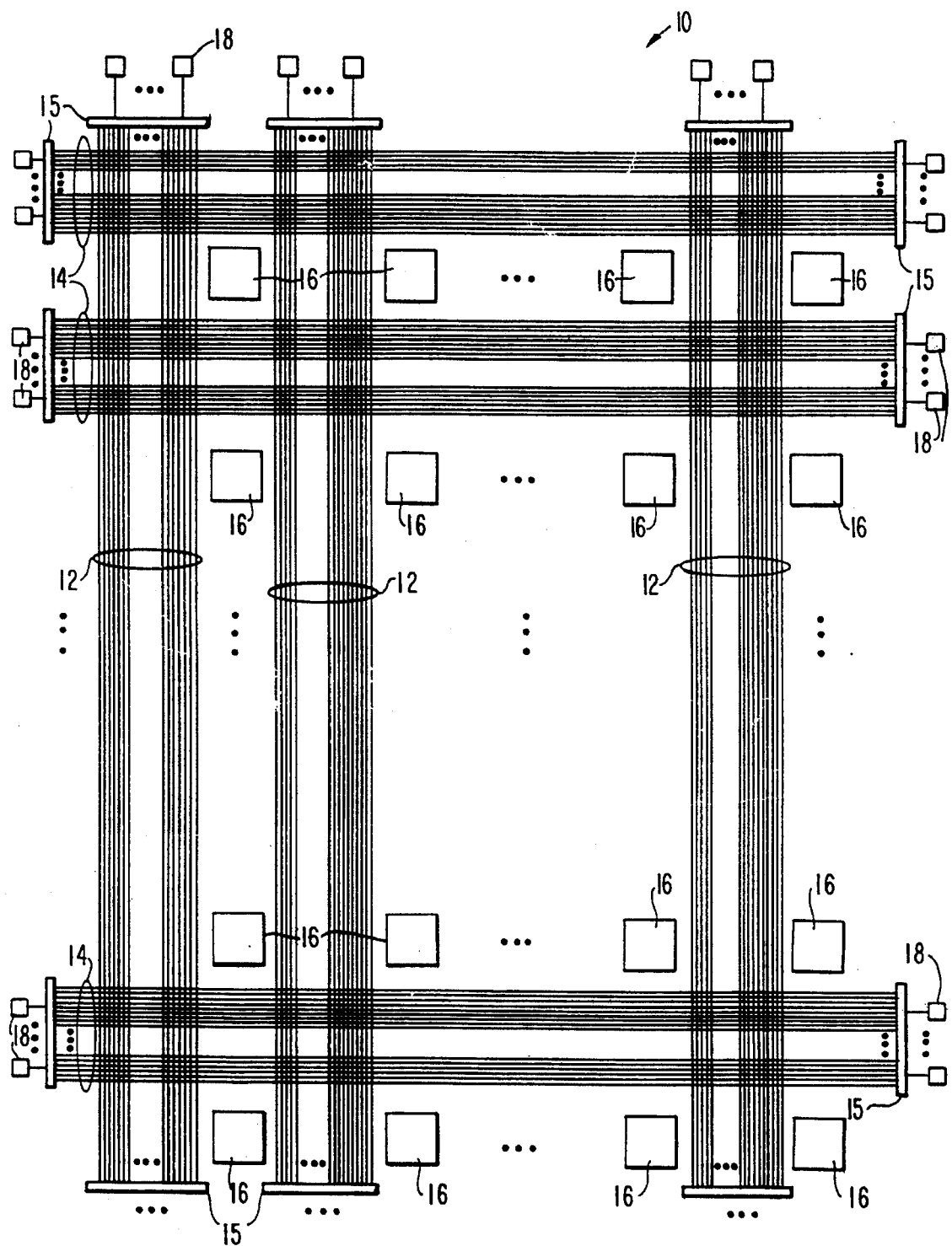
FIG. 1 is a simplified schematic block diagram of an illustrative embodiment of a programmable logic device constructed in accordance with the invention.

The general layout of an illustrative embodiment of programmable logic device 10 is shown in FIG. 1. Multiple global vertical conductors 12 and global horizontal conductors 14 are grouped in columns and rows, respectively. Within the rows and columns are logic array blocks 16. In a preferred embodiment, the programmable logic device 10 has eleven rows and seven columns. Preferably, each row contains 168 global horizontal conductors 14 and each column contains 48 global vertical conductors 12. Input/output pins 18, which are located at the periphery of the device, are connected to global vertical conductors 12 and global horizontal conductors 14 by programmable multiplexers and demultiplexers contained within circuit blocks 15. Global conductors (not shown) are used to provide various logic components of programmable logic device 10 with CLOCK, CLEAR, CLOCK ENABLE, and OUTPUT ENABLE signals.

Figure 2:
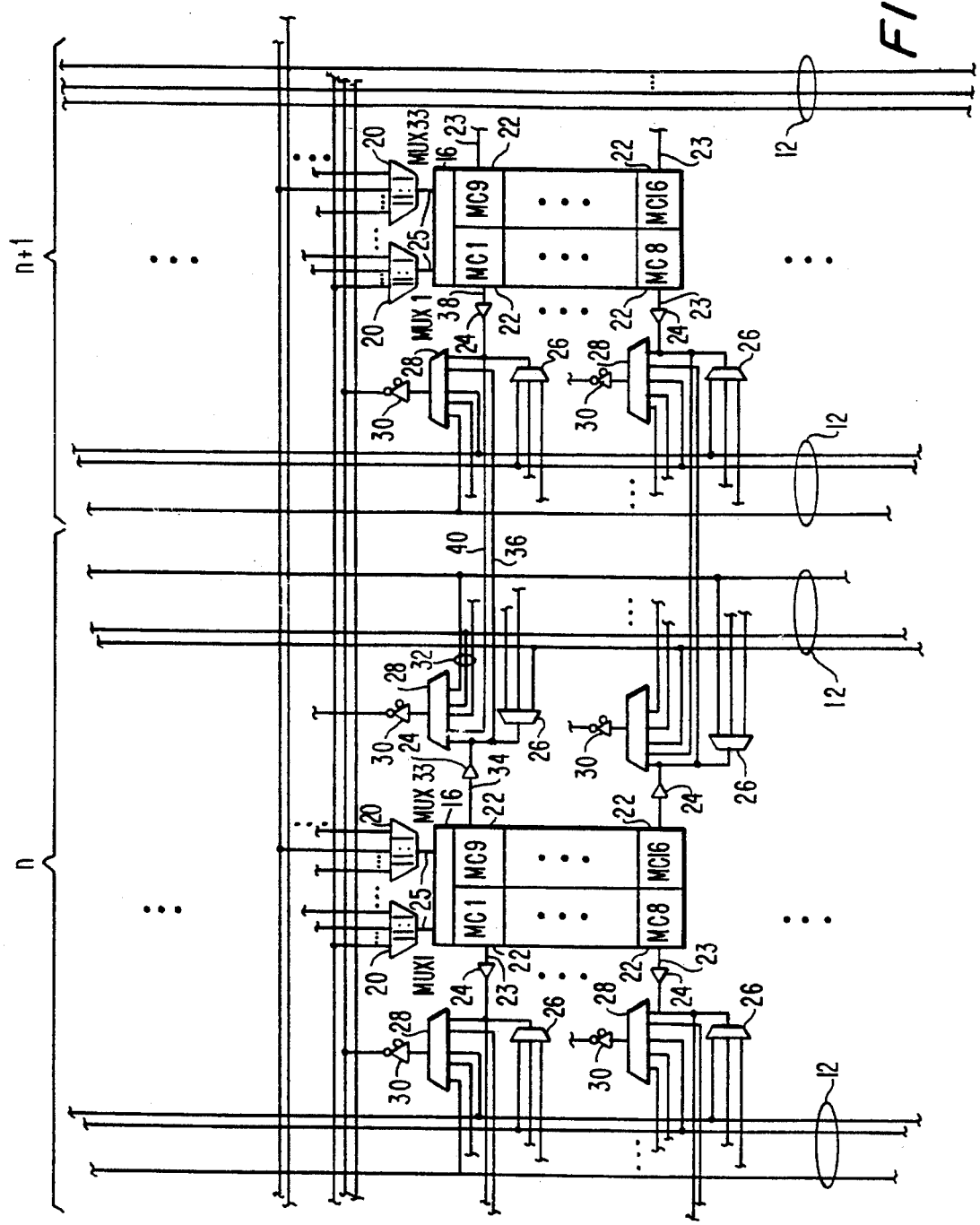
FIG. 2 is a more detailed schematic block diagram of a portion of the illustrative programmable logic device of FIG. 1, which shows connections to horizontal and vertical conductors.

A representative portion of programmable logic device 10 is shown in greater detail in FIG. 2. A portion of a single row is shown containing logic array blocks 16 from column n and column n+1. The input to each logic array block 16 is made through 11:1 multiplexers 20. The 11 input terminals of each 11:1 multiplexer 20 are connected to global horizontal conductors 14. Each logic array block 16 preferably contains 16 macrocells 22. Macrocells 22 can contain any suitable arrangement of programmable logic, including various configurations of look-up tables, programmable multiplexers and demultiplexers, registers, programmable logic gates, and arrays of programmable logic gates. In a preferred embodiment macrocells 22 have the functionality of the type of macrocell shown in commonly-assigned Pedersen U.S. Pat. No. 5,121,006, which is hereby incorporated by reference herein. Macrocells 22 can be programmed so that the signals at the logic array block output terminals 23 are a selected logic function of the signals at the input terminals 25.

Each macrocell 22 is connected to a corresponding macrocell output driver 24, which in turn is connected to 1:3 demultiplexer 26 and 5:1 multiplexer 28. The output terminals of the 5:1 multiplexers 28 are selectively connected to the global horizontal conductors 14 via tristate output drivers 30. Each demultiplexer 26 can be programmed to selectively connect the output terminal of one of the macrocells 22 to one of the three global vertical conductors 12 to which the demultiplexer 26 is connected. Each of the 48 global vertical conductors 12 in a column is connected to one of the output terminals of the 16 demultiplexers 26 in each logic array block in the column.

Similarly, each of the 16 multiplexers 28 associated with each logic array block 16 has three input terminals connected to the global vertical conductors 12 in the column. Preferably, the global vertical conductors 12 in each column are arranged in two sets of 24 conductors each. A first set, on the left-hand side of logic array block 16, is connected to the first eight macrocells in the block. A second set, on the right-hand side of logic array block 16, is connected to the remaining eight macrocells in the block.

In order to configure the programmable logic device 10 to perform a desired logic function, a user programs macrocells 22, multiplexers 20 and 28, and demultiplexers 26 using any convenient conventional programming technique. The programmable logic device 10 may contain programmable logic elements such as erasable programmable read-only memory (EPROM) transistors, static random-access memory, programmable fuses, antifuses, ferro-electric elements, or any suitable type of storage cell. Preferably, the programmable logic device 10 is based on electrically erasable programmable read-only memory ($E^2$PROM) transistors.

Because macrocells 22 are connected to global horizontal conductors 14 via output drivers 24, multiplexers 28, and tristate output drivers 30, the macrocell outputs of one logic array block 16 are available as inputs to other logic array blocks 16 via the multiplexers 20 connected to the other blocks. Further, when it is desired to connect the logic of one row to another, output signals from an appropriate macrocell 22 in the first row can be directed to a global vertical conductor 12 with one of the 1:3 demultiplexers 26. These signals can then be provided to the global horizontal conductors 14 of the second row with the 5:1 multiplexer 28 in the second row that is connected to the same global vertical conductor 12.

To maintain a highly flexible set of interconnections, and to ensure that interconnection pathways are blocked as infrequently as possible, many connections between conductors are made in random and mutually exclusive patterns, as this has been statistically shown to be less likely to lead to a blocked path than an ordered set of connections. For example, for each logic array block 16, the 48 input terminals of the multiplexers 28 that are connected to global vertical conductors 12 are connected in a random and mutually exclusive pattern. Similarly, the 16 outputs of the tristate output drivers 30 are connected in a random and mutually exclusive pattern to the global horizontal conductors 14. The inputs terminals of the 33 11:1 multiplexers 20 associated with each logic array block 16 are also connected to the horizontal conductors 14 in a random and mutually exclusive pattern. Each global horizontal conductor 14 is connected twice to the 11:1 multiplexers 20 in a logic array block 16, although the two connections must be made to separate multiplexers 20.

Because the multiplexers 28 are used to connect both the global vertical conductors 12 and the outputs of the macrocells 22 to the global horizontal conductors 14, conflicts may prevent the implementation of a desired logic design, unless alternate pathways are provided. Multiplexers 28 therefore have additional input terminals that allow the macrocells 22 in one logic array block 16 to be connected to the global horizontal conductors 14 through the multiplexers 28 in an adjacent column.

For example, if the multiplexer 28 that is connected to the ninth macrocell 22 in column n (MC9) is programmed to connect one of the global vertical conductors 12 attached to the input terminals 32 of multiplexer 28 to one of the global horizontal conductors 14, then that multiplexer 28 will be unavailable to connect macrocell output terminal 34 to the global horizontal conductors 14. However, macrocell output terminal 34 can be connected to one of the global horizontal conductors 14 via the multiplexer 28 in column n+1 that is connected to output 34 via output driver 24 and conductor 36. Similarly, if the multiplexer 28 associated with the first macrocell 22 in column n+1 (MC1) is used to connect one of the global vertical conductors 12 to one of the global horizontal conductors 14, then that multiplexer 28 will be unavailable to provide a pathway from macrocell output terminal 38 to the global horizontal conductors 14. However, by connecting macrocell output terminal 38 to the multiplexer 28 associated with the ninth macrocell 22 in column n (MC9) with conductor 40, it is possible to pass a signal from macrocell output terminal 38 to one of the global horizontal conductors 14.

Because conductors 36 and 40 provide alternate pathways for the output signals from macrocells 22, the output signals from the macrocells 22 that previously would have been blocked can be connected to the global horizontal conductors 14, which allows logic resources to be used more efficiently. For example, without interconnections such as conductors 36 and 40 between adjacent columns, if a macrocell output is to be provided to the global horizontal conductors 14 in the row, the macrocell output can only be directed to a single predetermined global horizontal conductor 14. However, overall design considerations may make it desirable to apply a different signal to that global horizontal conductor 14. In accordance with the present invention, the additional interconnections between adjacent columns provide alternate pathways for the outputs of the macrocells 22, so that the use of interconnection resources can be optimized.

In order to maximize the performance of the programmable logic device 10, the macrocells 22 in a logic array block 16 in one column may be selectively programmed to accommodate the pattern of interconnections in a logic array block 16 in an adjacent column. For example, if output signals from a logic array block 16 in column n+1 must be passed through a conductor such as conductor 40 to connect to a global horizontal conductor 14 via a multiplexer 28 in column n, then programmable logic device 10 can be designed so that macrocells 22 in the logic array block 16 in column n that are to be connected to the global horizontal conductors 14 are placed on the left-hand side of logic array block 16 (MC1–MC8). This arrangement allows the multiplexers 28 connected to macrocells MC9–MC16 in column n to remain free to receive signals from the adjacent logic array block 16 in column n+1.

The foregoing is merely illustrative of the principles of this invention and various modifications can be made by those skilled in the art without departing from the scope and spirit of the invention. For example, programmable logic device 10 can be constructed with any suitable number of rows and columns of logic and with a various arrangements of conductors and multiplexers. The number and type of macrocells per each logic array block can also be varied.

What is claimed is:

1. A programmable logic device comprising:

a plurality of rows and columns of logic array blocks, each logic array block having at least one input terminal for receiving input signals and at least one output terminal, each logic array block being programmable to produce output signals at the output terminal that are a selected logic function of the input signals;

a plurality of intercolumn conductors, each connected to a respective one of the output terminals and extending between adjacent columns of said logic array blocks;

a plurality of horizontal conductors in each row;

a horizontal output programmable logic circuit in each column and row for programmably connecting the horizontal conductors in each row to: (a) the output terminal of the logic array block in the same column as the horizontal output programmable logic circuit, and (b) the intercolumn conductor connected to the output terminal of the logic array block in a column adjacent to the column that contains the horizontal output programmable logic circuit;

a plurality of vertical conductors in each column; and a vertical output programmable logic circuit adjacent to each logic array block for programmably connecting the logic array block output terminals to the vertical conductors, wherein each horizontal output programmable logic circuit comprises a multiplexer having a multiplexer output terminal connected to one of the horizontal conductors, a first multiplexer input terminal connected to one of the vertical conductors in the same column as the multiplexer, a second multiplexer input terminal connected to one of the logic array block output terminals in the same column as the multiplexer, and a third multiplexer input terminal connected to one of the intercolumn conductors that is connected to a logic array block output terminal in a column adjacent to the column containing the multiplexer.

2. The programmable logic device defined in claim 1, wherein the vertical conductors extend entirely across the programmable logic device.

3. The programmable logic device defined in claim 1, wherein each vertical output programmable logic circuit comprises a programmable demultiplexer connected between one of the logic array block output terminals and a plurality of the vertical conductors for selectively connecting the logic array block output terminal to a selected one of the plurality of vertical conductors.

4. The programmable logic device defined in claim 1 further comprising an input programmable logic circuit adjacent to each logic array block in a row for programmably connecting the horizontal conductors in the row to the input terminals of the logic array blocks in the same row.

5. The programmable logic device defined in claim 4, wherein each input programmable logic circuit in a row comprises a plurality of programmable multiplexers each having a multiplexer output terminal connected to one of the logic array block input terminals and each having a plurality of multiplexer input terminals connected to the horizontal conductors in the row.

6. The programmable logic device defined in claim 1, wherein the horizontal conductors extend entirely across the programmable logic device.

7. The programmable logic device defined in claim 1, wherein:

each logic array block has a plurality of output terminals; and the logic array blocks contain a plurality of programmable macrocells of logic, each macrocell having a macrocell output that is connected to one of the logic array block output terminals for providing the output terminals with the output signals.

8. A programmable logic device comprising:

a plurality of rows and columns of logic array blocks, each logic array block having a plurality of input terminals for receiving input signals and a plurality of output terminals, each logic array block being programmable to produce output signals at the output terminals that are a selected logic function of the input signals, each logic array block containing a plurality of macrocells that are connected to the output terminals for providing the output terminals with the output signals;

a plurality of intercolumn conductors, each connected to a respective one of the output terminals and extending between adjacent columns of said logic array blocks;

a plurality of horizontal conductors in each row;

a plurality of vertical conductors in each column; and a horizontal output programmable logic circuit connected to the logic array block in each column and row for programmably connecting the horizontal conductors in each row to: (a) one of the vertical conductors in the same column as the horizontal output programmable logic circuit, (b) one of the logic array block output terminals in the same column as the horizontal output programmable logic circuit, and (c) the intercolumn conductor connected to one of the logic array block output terminals in a column adjacent to the column containing the horizontal output programmable logic circuit, wherein each horizontal output programmable logic circuit comprises a multiplexer having a multiplexer output terminal connected to one of the horizontal conductors, a first multiplexer input terminal connected to one of the vertical conductors in the same column as the multiplexer, a second multiplexer input terminal connected to one of the logic array block output terminals in the same column as the multiplexer, and a third multiplexer input terminal connected to one of the logic array block output terminals in a column adjacent to the column containing the multiplexer.

9. The programmable logic device defined in claim 8 further comprising a vertical output programmable logic circuit adjacent to each logic array block for programmably connecting the logic array block output terminals to the vertical conductors.

10. The programmable logic device defined in claim 9, wherein each vertical output programmable logic circuit comprises a programmable demultiplexer connected between one of the logic array block output terminals and a plurality of the vertical conductors for selectively connecting the logic array block output terminal to a selected one of the plurality of vertical conductors.

11. The programmable logic device defined in claim 8 further comprising an input programmable logic circuit adjacent to each logic array block in a row for programmably connecting the horizontal conductors in the row to the input terminals of the logic array blocks in the same row.

12. The programmable logic device defined in claim 11, wherein each input programmable logic circuit in a row comprises a plurality of programmable multiplexers each having a multiplexer output terminal connected to one of the logic array block input terminals and each having a plurality of multiplexer input terminals connected to the horizontal conductors in the row.

13. The programmable logic device defined in claim 8, wherein the vertical conductors extend entirely across the programmable logic device.

14. The programmable logic device defined in claim 8 wherein the horizontal conductors extend entirely across the programmable logic device.

15. A programmable logic device comprising:

a plurality of rows and columns of logic array blocks, each logic array block having at least one input terminal for receiving input signals and at least one output terminal, each logic array block being programmable to produce output signals at the output terminal that are a selected logic function of the input signals;

a plurality of intercolumn conductors, each connected to a respective one of the output terminals and extending between adjacent columns of said logic array blocks;

a plurality of horizontal conductors in each row; and a plurality of programmable switches in each row and column, each programmable switch having a programmable switch output terminal connected to one of the horizontal conductors and having a plurality of programmable switch input terminals; wherein, for a given pair of two adjacent columns of logic array blocks:

a first of the two columns contains a first logic array block with a first output terminal connected to a first of the programmable switch input terminals of a first programmable switch;

a second of the two columns contains a second logic array block with a second output terminal connected to a first of the programmable switch input terminals of a second programmable switch;

the first output terminal is further connected by a first one of the intercolumn conductors to a second of the programmable switch input terminals of the second programmable switch;

the second output terminal is further connected by a second one of the intercolumn conductors to a second of the programmable switch input terminals of the first programmable switch;

the output terminal of the first programmable switch is connected to a first one of the horizontal conductors; and the output terminal of the second programmable switch is connected to a second one of the horizontal conductors.

* * * * *